(12) United States Patent
Park

(10) Patent No.: US 9,799,975 B2
(45) Date of Patent: Oct. 24, 2017

(54) CONNECTION MEMBER FOR AN ELECTRONIC DEVICE

(71) Applicant: Samsung Electronics Co., Ltd., Gyeonggi-do (KR)

(72) Inventor: Juneseok Park, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/164,198

(22) Filed: May 25, 2016

(65) Prior Publication Data

US 2016/0352032 A1   Dec. 1, 2016

(30) Foreign Application Priority Data

May 26, 2015 (KR) ......................... 10-2015-0072796

(51) Int. Cl.

| | |
|---|---|
| *H01R 13/60* | (2006.01) |
| *H01R 12/79* | (2011.01) |
| *H05K 3/32* | (2006.01) |
| *H01R 12/77* | (2011.01) |
| *H01R 12/71* | (2011.01) |
| *H01R 13/24* | (2006.01) |
| *H01R 13/62* | (2006.01) |

(52) U.S. Cl.
CPC ........... *H01R 12/79* (2013.01); *H01R 12/771* (2013.01); *H05K 3/325* (2013.01); *H01R 12/714* (2013.01); *H01R 13/24* (2013.01); *H01R 13/6205* (2013.01); *H05K 2201/0311* (2013.01); *H05K 2201/1031* (2013.01); *H05K 2201/10189* (2013.01); *H05K 2201/10265* (2013.01); *H05K 2203/104* (2013.01)

(58) Field of Classification Search
CPC .................. H01R 13/6205; H01R 2201/02
USPC ....................................... 439/38, 39, 66, 862
See application file for complete search history.

(56) References Cited

U.S. PATENT DOCUMENTS

| 6,224,396 B1 | 5/2001 | Chan et al. | |
|---|---|---|---|
| 6,337,663 B1 * | 1/2002 | Chi-Ming ............... | H01Q 1/243 343/700 MS |

(Continued)

FOREIGN PATENT DOCUMENTS

| KR | 10-0833161 B1 | 5/2008 |
|---|---|---|
| KR | 10-2011-0092975 A | 8/2011 |

(Continued)

OTHER PUBLICATIONS

European Search Report, dated Oct. 24, 2016.

*Primary Examiner* — Neil Abrams
(74) *Attorney, Agent, or Firm* — Cha & Reiter, LLC.

(57) ABSTRACT

An electronic device may include: a printed circuit board (PCB); a plurality of electronic components electrically connected to the PCB; and a connection member comprising a first portion fixed to one of the PCB and an electronic component and a second portion magnetically connected to the other one of the PCB and the electronic component. The second portion of the connection member may be moveably connected to the first portion. The connection member may further include a stopper, and may be designed to minimize the repulsive force provided by the connection member when excessive pressure is applied to the electronic device.

12 Claims, 21 Drawing Sheets

(56) References Cited

U.S. PATENT DOCUMENTS

| | | | | |
|---|---|---|---|---|
| 6,512,491 B2* | 1/2003 | Kanayama | | H01Q 1/243 343/702 |
| 7,598,924 B2* | 10/2009 | Hynes | | H01Q 1/243 343/702 |
| 8,187,006 B2* | 5/2012 | Rudisill | | H01R 11/30 362/249.06 |
| 8,361,646 B2* | 1/2013 | Ferber, Jr. | | H01R 12/00 429/158 |
| 8,587,485 B2* | 11/2013 | Tahk | | H01Q 1/243 343/702 |
| 9,196,979 B2* | 11/2015 | Kim | | H01R 13/24 |
| 9,450,294 B2* | 9/2016 | Cho | | H01Q 1/243 |
| 9,461,391 B2* | 10/2016 | Kato | | H01R 13/6594 |
| 2005/0017902 A1* | 1/2005 | Oyama | | H01Q 1/241 343/700 MS |
| 2006/0290591 A1* | 12/2006 | Nilsson | | H01Q 1/1207 343/906 |
| 2010/0331050 A1 | 12/2010 | Tahk et al. | | |
| 2012/0217050 A1 | 8/2012 | Kurita et al. | | |
| 2015/0311619 A1 | 10/2015 | Kato | | |
| 2016/0352032 A1* | 12/2016 | Park | | H01R 12/771 |

FOREIGN PATENT DOCUMENTS

| | | |
|---|---|---|
| KR | 10-2011-0120483 A | 11/2011 |
| KR | 10-1333114 B1 | 11/2013 |
| KR | 10-2015-0024760 A | 3/2015 |
| WO | 2014/084293 A1 | 6/2014 |
| WO | 2014/132976 A1 | 9/2014 |

* cited by examiner

FIG. 12B

| Band | LowBand (824~960MHz) | MidBand (1710~1990MHz) | HighBand (1920 ~ 2170MHz) |
|---|---|---|---|
| Before applying | 21.0% | 43.8% | 57.3% |
| After applying | 25.1% | 45.0% | 52.4% |

CONNECTION MEMBER FOR AN ELECTRONIC DEVICE

CLAIM OF PRIORITY

This application claims priority from and the benefit, under 35 U.S.C. §119(a), of Korean patent application no. 10-2015-0072796, filed on May 26, 2015, which is hereby incorporated by reference in its entirety.

BACKGROUND

Technical Field

Various exemplary embodiments of the present disclosure relate to an electronic device having a magnetic body and a connection member in order to connect a Printed Circuit Board (PCB) and an electronic component therein.

Description of the Related Art

In general, an electronic device such as a mobile terminal includes an electrically conductive member having a predetermined elastic force in order to transfer an electric signal between a PCB and a component terminal. Such an electrically conductive member performs a function of receiving an electric signal from the PCB and transferring an electric signal to each component through a terminal mounted in each component.

In order to prevent a contact point from being separated because of an external impact, the electrically conductive member has an elastic force and is located between the PCB. The electrically conductive member is designed to have a repulsive force of a predetermined value or more. Therefore, by such a repulsive force, the electrically conductive member applies a predetermined pressure to the PCB or the terminal connected to both ends thereof. While such a pressure is maintained, when an unintended impact occurs or an excessive pressure occurs in the electronic device, a problem may occur. For example, the electrically conductive member damages a component connected to both ends thereof or a component connected to both ends thereof is lifted.

In particular, when the terminal connected to the electrically conductive member is mounted in an antenna structure body, there is a problem that minute damage (e.g., crack phenomenon, structure body lifting phenomenon according to a repulsive force) may have a serious influence on an antenna performance deviation. Nothing in the foregoing discussion of the state of the art is to be construed as an admission of the prior art.

SUMMARY

The present disclosure has been made in view of the above problems and provides an electronic device having a magnetic body and a connection member in order to connect a PCB and an electronic component therein.

In accordance with an aspect of the present disclosure, an electronic device may include a PCB, a plurality of electronic components electrically connected to the PCB; and a connection member comprising a first portion fixed to one of the PCB and an electronic component and a second portion magnetically connected to the other one of the PCB and the electronic component. The second portion of the connection member may be moveably connected to the first portion. A magnetic body may be mounted or embedded in any one of the PCB, the electronic component, and the second portion of the connection member. The connection member may be formed in a shape "Z", the "Z" shape including a "7" shaped section and a leg hingedly attached to the "7" shape, thereby forming the "Z" shape. A connection portion may include a holding hole and a protruding portion, wherein the first portion includes the protruding portion at one end, and the second portion includes the housing hole that houses the protruding portion. The device may also include a connection portion including a fixing groove at one end of the first portion, the second portion including a corresponding groove facing the fixing groove, and a fixing pin that penetrates the fixing groove and the corresponding groove to fix the first portion and the second portion. The connection member may also include a stopper, the stopper being coupled to the first portion and limiting the second portion from rotating in a direction that reduces an angle formed between the second portion and the first portion. The stopper may protrude toward the second portion at one side of the first portion. The second portion may be made of a material that has a flexibility greater than that of the first portion. At least one of the plurality of electronic components may include a Flexible Printed Circuit Board (FPCB), and the connection member connects the FPCB and a PCB. The plurality of electronic components may include an antenna pattern, key FPCB, and motor FPCB of the electronic device. The electronic component may also include a strength reinforcing member at a surface opposite to a surface contacting with the connection member. The magnetic body may be a neodymium magnet, and the outside of the magnetic body is plated with nickel. The connection member may be made of a SUS-based material, and the outside of the connection member is plated with nickel.

These and other aspects of the present are more fully described hereinbelow with reference to the accompanying figures.

BRIEF DESCRIPTION OF THE DRAWINGS

The above features, and advantages of the present disclosure will be more apparent from the following detailed description in conjunction with the accompanying drawings, in which:

FIG. 12A and FIG. 12B are a graph and a chart illustrating a comparison experimental value of an antenna performance before and after using a connection member and a magnetic body in an electronic device according to an exemplary embodiment of the present disclosure.

DETAILED DESCRIPTION

Hereinafter, various exemplary embodiments of the present disclosure will be described in detail with reference to the accompanying drawings. The same reference numbers are used throughout the drawings to refer to the same or like parts. Further, detailed descriptions of well-known functions and structures incorporated herein may be omitted to avoid obscuring the subject matter of the present disclosure. In the following description, only a portion necessary for understanding operation according to various exemplary embodiments of the present disclosure may be described, and a description of other portions may be omitted to avoid obscuring the subject matter of the present disclosure.

An electronic device 100 according to various exemplary embodiments of the present disclosure may include at least one of, for example, a smart phone, tablet Personal Computer (tablet PC), mobile phone, video phone, e-book reader, desktop PC, laptop PC, netbook computer, workstation, server, Personal Digital Assistant (PDA), Portable Multimedia Player (PMP), Moving Picture Experts Group layer-3 (MP3) player, mobile medical device, camera, and wearable device.

Figure 1:
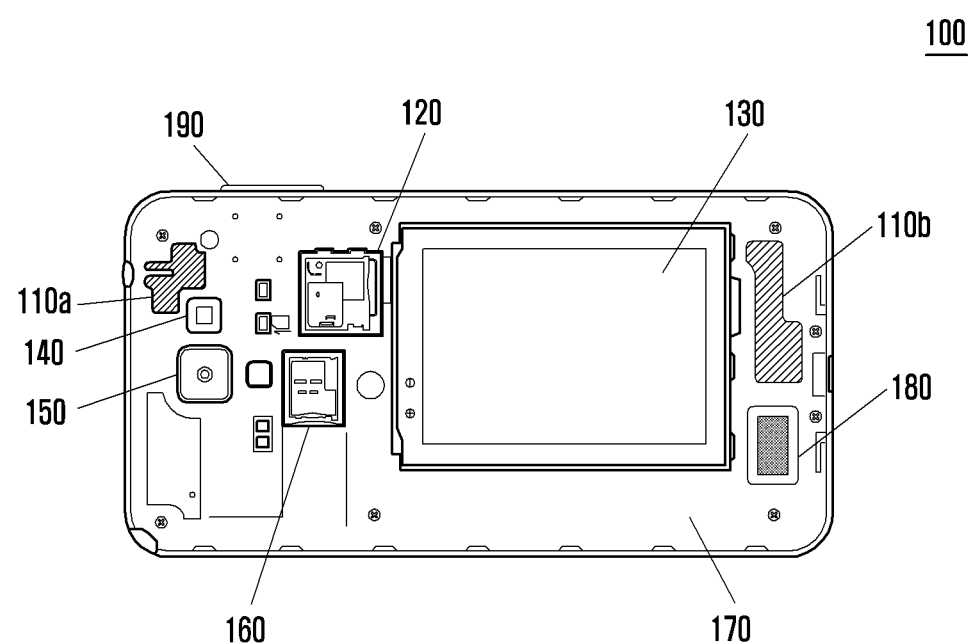
FIG. 1 is a diagram illustrating an electronic device in which a battery cover is separated according to an exemplary embodiment of the present disclosure.

FIG. 1 is a diagram illustrating an electronic device 100 in which a battery cover is separated according to an exemplary embodiment of the present disclosure.

Referring to FIG. 1, a rear surface of a body of the electronic device 100 may include antenna structure bodies 110a and 110b, a Subscriber Identification Module (SIM) card 120, a battery 130, a camera module flash 140, a camera module 150, a Secure Digital (SD) card 160, a rear case 170, an audio output unit 180, and a side key 190. However, such components and a location, size, and arrangement of the components may be changed or added to according to a kind and size of the electronic device.

Further, the electronic device 100 may include other components in addition to components of FIG. 1. For example, the electronic device 100 may include various modules such as, for example, a bus, processor, memory, input and output interface, display, and communication interface. The entire or a portion of such a module may perform a function of components of FIG. 1 through hardware, software, or firmware.

Figure 2A:
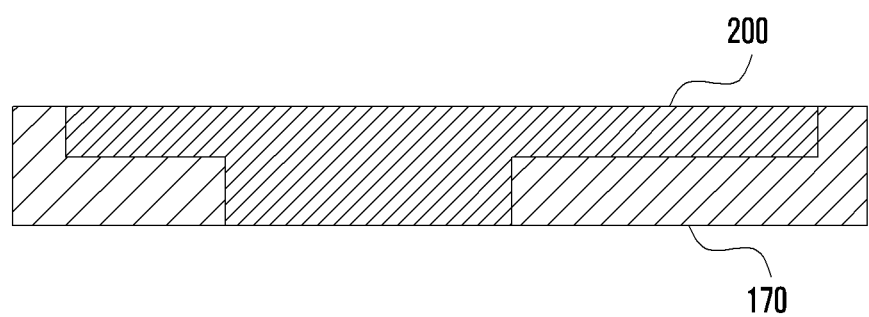
FIG. 2A, FIG. 2B and FIG. 2C are diagrams illustrating an electronic device having different antenna mounting locations according to various exemplary embodiments of the present disclosure.
Figure 2B:
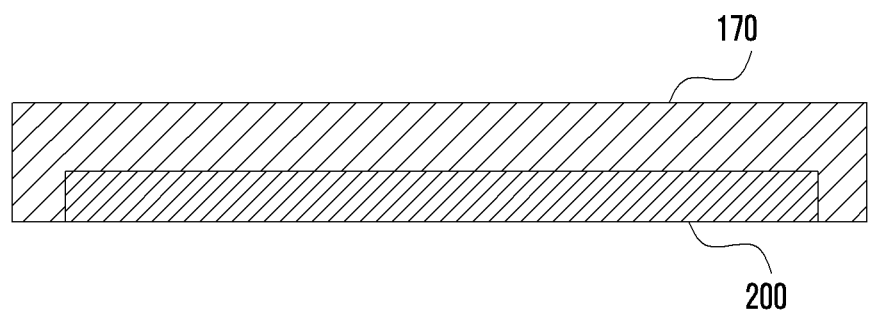
Figure 2C:
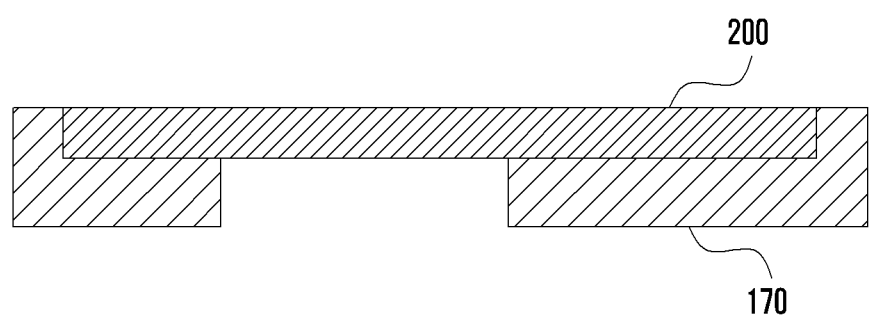

FIGS. 2A to 2C are diagrams illustrating a terminal structure according to antenna mounting locations in the electronic device 100 according to various exemplary embodiments of the present disclosure.

The electronic device 100 according to various exemplary embodiments of the present disclosure may be formed in any one structure of FIGS. 2A to 2C according to a design thereof, whether the battery 130 is a built-in type, and a thickness of the rear case 170.

According to an exemplary embodiment, the electronic device 100 may include a rear external carrier type antenna structure body 200 and a rear case 170, as shown in FIG. 2A. In order to cover a partial area of the rear case 170, an upper portion of the antenna structure body 200 may be coupled to the rear case 170, and by penetrating a portion of the rear case 170, a bottom surface of a lower portion of the antenna structure body 200 may be coupled to the rear case 170 so as to expose in a PCB (not shown) direction. Although not shown in the drawing, the lower portion of the antenna structure body 200 may include an antenna terminal. Such an antenna terminal may, for example, collect a signal from the PCB and transfer the signal to a radiating body of the antenna structure body 200. The antenna structure body 200 may be formed in a pattern. A terminal of the antenna structure body 200 may be mounted in a form included in a pattern of the antenna structure body 200.

According to another exemplary embodiment, the electronic device 100 may include a rear internal type antenna structure body 200 and a rear case 170, as shown in FIG. 2B. An upper portion and a side portion of the antenna structure body 200 may be coupled to the rear case 170 to be enclosed by the rear case 170, and a bottom surface of a lower portion of the antenna structure body 200 may be coupled to the rear case 170 to be exposed toward the PCB. The antenna structure body 200 of FIG. 2B may include an antenna radiating body.

According to another exemplary embodiment, the electronic device 100 may include a rear external type antenna structure body 200 and a rear case 170, as shown in FIG. 2C. The antenna structure body 200 may be received in a groove of the rear case 170, and a portion of a lower portion of the antenna structure body 200 may be coupled to the rear case 170 to be exposed toward the PCB in a hole of the rear case 170. As in FIGS. 2A and 2B, the antenna structure body 200 of FIG. 2C may include an antenna radiating body.

FIGS. 3A to 3D are diagrams illustrating a structure of a connection member 400 according to a magnetic body mounting location in an electronic device 100 according to various exemplary embodiments of the present disclosure.

For convenience of description, it is assumed that the antenna structure body 200 and the rear case 170 are the rear external carrier type antenna structure body 200 and the rear case 170 of FIG. 2A. In the following exemplary embodiment, such a connection member 400 may be defined as a damping contact member 400.

According to an exemplary embodiment, as a magnetic body 500, a Neodymium (ND) magnet may be used, and in order to prevent oxidation and corrosion and to improve electric conductivity, the magnetic body 500 may be plated with gold or nickel. According to various exemplary embodiments of the present disclosure, the magnetic body 500 may have various intensities. For example, in order to maintain a contact point between the damping contact member 400 and the magnetic body 500, the magnetic body 500 may be formed with a magnet having a magnetic force corresponding to pressing amount specification information of the damping contact member 400. The magnetic body 500 shown in the following drawings may have various lengths and shapes according to a connection structure of the damping contact member 400 and an electronic component of the electronic device 100.

According to an exemplary embodiment, when an external impact is applied, the damping contact member 400 may have a structure that provides a damper function. For this reason, the damping contact member 400 may be implemented in a shape "Z", and the entire or a portion of the damping contact member 400 may be made of a material having a predetermined elastic force. In this case, in order to minimize a repulsive force of the damping contact member 400, a pressing amount of the damping contact member 400 may be designed to correspond to a predetermined specification. Further, the damping contact member 400, a terminal of the antenna structure body 200, and a PCB 300 may be made of a material (e.g., ferromagnetic substance) that can contact with the magnetic body 500 by a magnetic force and may be made of a material having electric conductivity.

According to an exemplary embodiment, the PCB 300 may be a main PCB that supplies a signal such as a current to each component terminal within the electronic device 100. The PCB 300 may further have a structure related to a corresponding component by the damping contact member 400 according to a component connected to the PCB 300. For example, when the damping contact member 400 is connected to the terminal of the antenna structure body 200, the PCB 300 may include a power supply unit for supplying a current to the terminal.

One end of the damping contact member 400 may be fixed to the antenna structure body 200 or the rear case 170. For example, one end of the damping contact member 400 may be soldered to be fixed to the antenna structure body 200 or the PCB 300.

Further, the other end of the damping contact member 400 may be connected to the magnetic body 500 in a form contacting with the magnetic body 500 by a magnetic force of the magnetic body 500. Such a magnetic body 500 may be mounted in the terminal of the antenna structure body 200, the PCB 300, or the damping contact member 400.

Figure 3A:
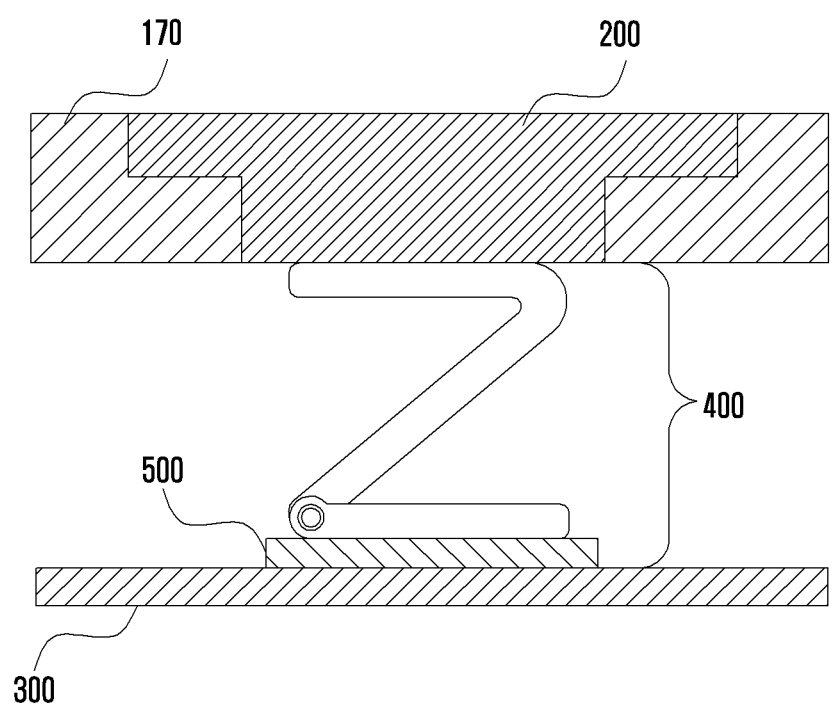
FIG. 3A, FIG. 3B, FIG. 3C and FIG. 3D are diagrams illustrating a structure of a connection member according to a magnetic body mounting location in an electronic device according to various exemplary embodiments of the present disclosure.

According to an exemplary embodiment, the electronic device 100 may have a structure in which the magnetic body 500 is mounted in the PCB 300, as shown in FIG. 3A. For example, the magnetic body 500 of FIG. 3A may be fixed to the PCB 300 by soldering.

According to an exemplary embodiment, an upper surface, which is one end of the damping contact member 400 may be fixed to the antenna structure body 200. For example, an upper surface of the damping contact member 400 may be fixed to the terminal of the antenna structure body 200 by soldering.

According to an exemplary embodiment, a lower surface, which is the other end of the damping contact member 400, may contact with the magnetic body 500 by a magnetic force. For example, a lower surface of the damping contact member 400 may rotate or may be inclined toward the magnetic body 500 by attraction. Such an inclination operation or a rotation operation may be performed through a structure of FIGS. 4 to 8 to be described later.

The damping contact member 400 of FIG. 3A electrically connects the terminal of the antenna structure body 200 and the PCB 300 in which the magnetic body 500 is mounted, and one end thereof is fixed to the terminal of the antenna structure body 200 and the other end thereof contacts with the magnetic body 500 by a magnetic force.

Figure 3B:
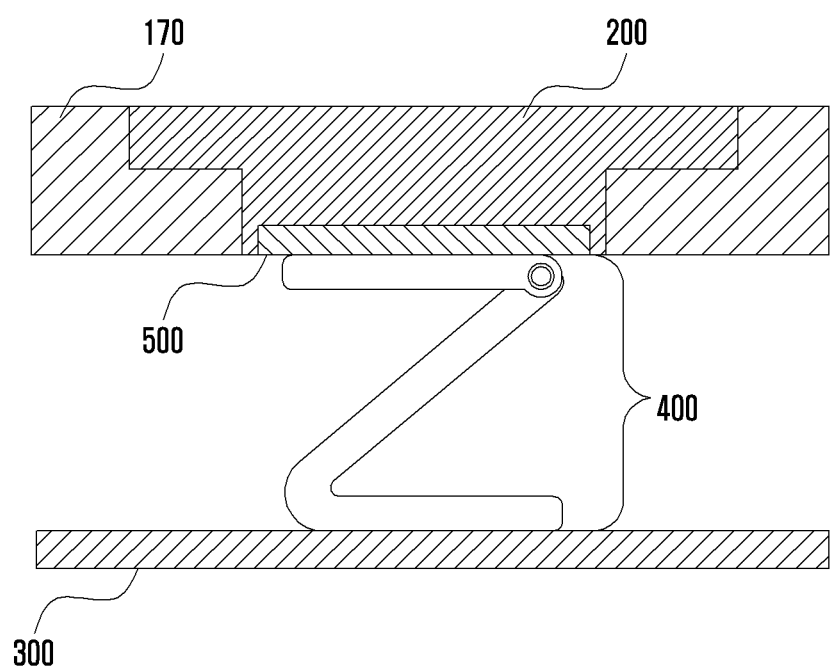

According to an exemplary embodiment, the electronic device 100 may have a structure in which the magnetic body 500 is mounted in the antenna structure body 200, as shown in FIG. 3B. For example, the magnetic body 500 of FIG. 3B may be fixed to the terminal of the antenna structure body 200 by soldering or may be embedded in the terminal of the antenna structure body 200.

In this case, unlike FIG. 3A, a lower surface of the damping contact member 400 may be fixed to the PCB 300. For example, a lower surface, which is one end of the damping contact member 400 may be fixed to the PCB 300 by soldering. Further, an upper surface, i.e., the other end of the damping contact member 400, may contact with the magnetic body 500 by a magnetic force. For example, an upper surface of the damping contact member 400 may rotate or may be inclined toward the magnetic body 500 by attraction. Such an inclination operation or a rotation operation may be performed through a structure of FIGS. 4 to 8 to be described later.

The damping contact member 400 of FIG. 3A may electrically connect the PCB 300 and the terminal of the antenna structure body 200 in which the magnetic body 500 is embedded, and one end thereof may be fixed to the PCB 300 and the other side thereof contacts with the magnetic body 500 by a magnetic force.

Figure 3C:
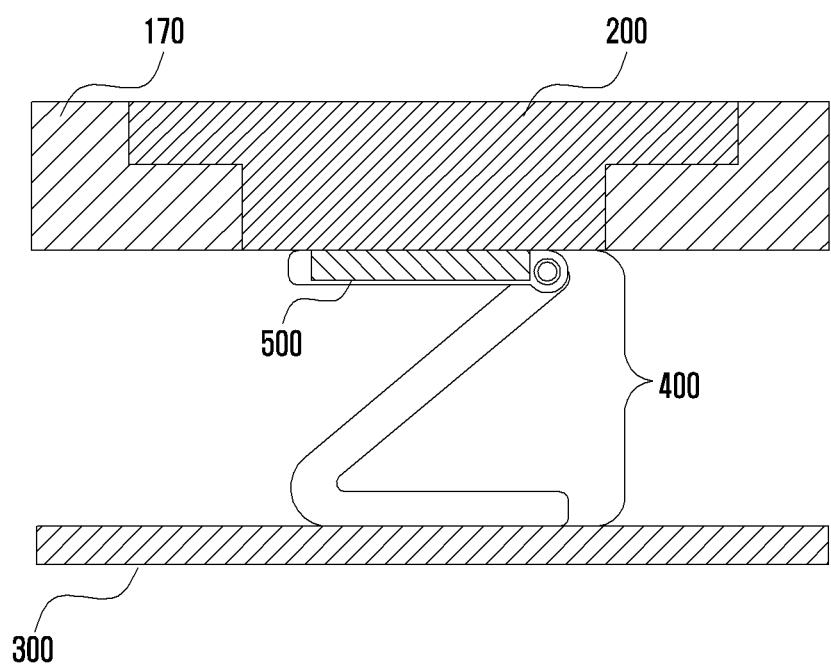
Figure 3D:
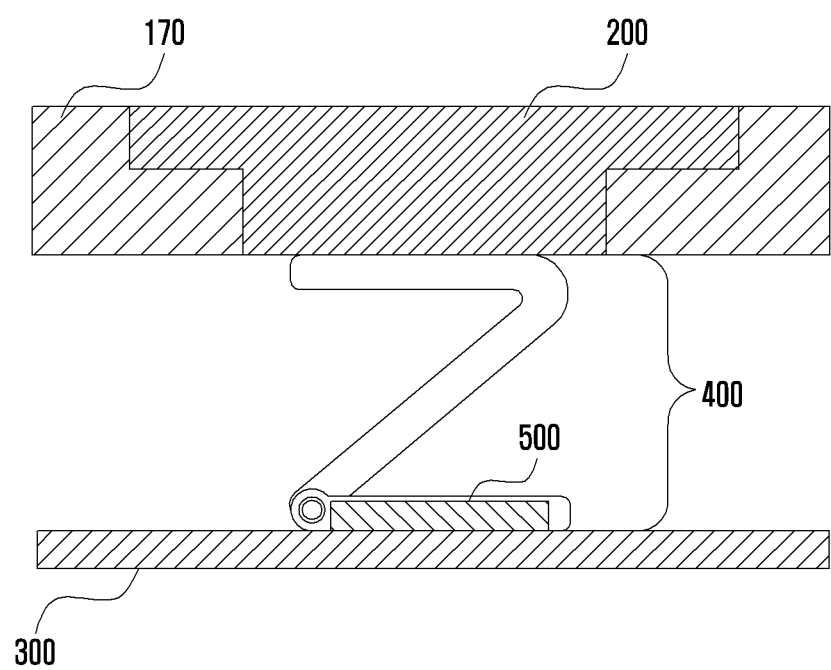

According to an exemplary embodiment, the electronic device 100 may have a structure in which the magnetic body 500 is mounted in the damping contact member 400, as shown in FIGS. 3C and 3D. For example, the magnetic body 500 may be mounted or embedded at any one end (e.g., an upper surface or a lower surface) of the damping contact member 400. As shown in FIGS. 3C and 3D, the embedded magnetic body 500 may be embedded at the inside of the damping contact member 400 not to be viewed from the outside of the damping contact member 400.

As shown in FIG. 3C, the electronic device 100 may have a structure in which the magnetic body 500 is embedded in an upper portion of the damping contact member 400. According to an exemplary embodiment, a lower surface of the damping contact member 400 may be fixed to the PCB 300. For example, a lower surface, which is one end of the damping contact member 400, may be fixed to the PCB 300 by soldering. Further, an upper portion of the damping contact member 400 may contact with the terminal of the antenna structure body 200 by a magnetic force of the magnetic body 500 embedded in an upper portion of the damping contact member 400. For example, the upper portion of the damping contact member 400 may rotate or may be inclined to contact with the terminal of the antenna structure body 200 by a magnetic force. For this reason, the damping contact member 400 may have a structure of FIGS. 4 to 8 to be described later.

As shown in FIG. 3D, the electronic device 100 may have a structure in which the magnetic body 500 is embedded in a lower portion of the damping contact member 400. According to an exemplary embodiment, an upper surface of the damping contact member 400 may be fixed to the terminal of the antenna structure body 200. For example, an upper surface, which is one end of the damping contact member 400, may be fixed to the terminal of the antenna structure body 200 by soldering. Further, the lower portion of the damping contact member 400 may contact with the PCB 300 by a magnetic force of the magnetic body 500. For example, the lower portion of the damping contact member 400 may rotate or may be inclined to contact with the PCB 300 by a magnetic force. For this reason, the damping contact member 400 may have a structure of FIGS. 4 to 8 to be described later.

As described above, a structure of the damping contact member 400 may be connected in a form in which one end thereof is fixed to a first component (e.g., terminal) and in which the other end thereof contacts with a second component (e.g., a PCB) by a magnetic force of the magnetic body. By minimizing a repulsive force of the damping contact member 400 by a fixing structure of the damping contact member 400 and a contact structure using the magnetic body 500, physical damage of the antenna structure body 200 or the PCB 300 can be minimized.

Figure 4:
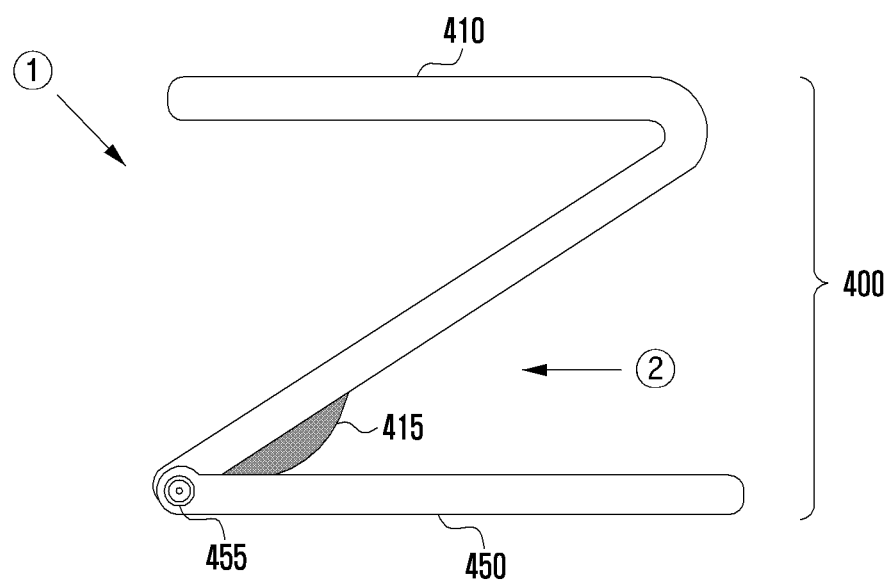
FIG. 4 is a side view illustrating a connection member according to an exemplary embodiment of the present disclosure.

FIG. 4 is a side view illustrating a damping contact member 400 according to an exemplary embodiment of the present disclosure. The damping contact member 400 of FIG. 4 specifically illustrates a connection structure of the damping contact member 400 of FIGS. 3A to 3D. Such a damping contact member 400 may include a first portion 410 and a second portion 450.

The first portion 410 may be fixed to a specific component within the electronic device 100. For example, the first portion 410 may be fixed to the terminal or the PCB 300 within the electronic device 100 by soldering. Specifically, an upper surface of the first portion 410 may be fixed to the terminal or the PCB 300 by soldering to perform a point contact, line contact, or surface contact. As at least a portion of the first portion 410 is fixed to another component, such a first portion 410 fixes the damping contact member 400. As shown in FIG. 4, the first portion 410 may be formed in a "7"-shaped portion in a "Z" shaped damping contact member 400. According to various exemplary embodiments, in the first portion 410, a "–" shaped horizontal surface and a "/" shaped diagonal surface may be integrally formed in one piece. In order to provide a damper function, the first portion 410 may be formed in a predetermined thickness, and such a first portion may have a thickness different from or the same thickness as that of the second portion 450.

It is shown that the first portion 410 of FIG. 4 forms an upper portion of the damping contact member 400, but it may form a lower portion of the damping contact member 400 according to a location and direction in which the damping contact member 400 is inserted within the electronic device 100. For example, as shown in FIGS. 3B and 3C, the first portion 410 may be formed in a "∠" shape, and a portion "_", which is a lower surface, may be fixed to the PCB 300 by soldering.

The second portion 450 may directly contact with the magnetic body 500 by a magnetic force of the magnetic body 500 or may contact with a specific component within the electronic device 100 by including the magnetic body 500. According to an exemplary embodiment, the second portion 450 of the damping contact member 400 may be moveably connected to the first portion 410. As shown in FIG. 4, such a second portion 450 may be formed in a "_" or "–" shaped portion in a "Z"-shaped damping contact member 400. It is to be understood that that "_" and "–" shaped portions refer to the upper and lower substantially parallel surfaces of the Z-shape.

As described above, because the damping contact member 400 forms a "Z"-shaped structure by coupling of the first portion 410 and the second portion 450, the damping contact member 400 may stably provide a damper function, unlike an existing "C"-shaped connection member. Specifically, because the damping contact member 400 includes a flat surface in an upper portion and a lower portion, even if the damping contact member 400 vertically receives a load, the damping contact member 400 may stably perform a damper function.

According to an exemplary embodiment, the damping contact member 400 may include a connection portion 455, which may be hinged, that connects the first portion 410 and the second portion 450. The connection portion 455 may have a structure that guides the second portion 450 to rotate relative to the first portion 410. Such a connection portion 455 may have a form of a hinge structure such that the second portion 450 coupled to the first portion 410 rotates.

According to various exemplary embodiments, the connection portion 455 may be formed with at least one protruding portion formed at one end of the first portion 410 and at least one housing hole formed at one end of the second portion 450 and that houses a protruding portion. In this case, the housing hole may be formed at a location that contacts with one end of the first portion 410. When the protruding portion and the housing hole are coupled, the connection portion 455 may be formed in a predetermined specification such that the second portion 450 rotates based on the coupling.

The connection portion 455 of FIG. 4 is generated by coupling of a partial area of the first portion 410 changed to a protruding portion and a partial area of the second portion 450 changed to a housing hole, but the present disclosure is not limited thereto. For example, the connection portion 455 may be formed in an independent configuration separate from the second portion 450 and the first portion 410. In this case, the connection portion 455, the second portion 450, and the first portion 410 may include various connection means for a mutual connection. Further, the connection portion 455 may be generated by extension from or change of at least one of the first portion 410 and the second portion 450.

According to various exemplary embodiments, it may be described that a structure of the damping contact member 400 is a change structure of the first portion 410 and the second portion 450 without necessity to separately define a structure of the damping contact member 400 by the connection portion 455. For example, the first portion 410 of the damping contact member 400 may form at least one protruding portion at one end, and the second portion 450 may form at least one housing hole that houses the protruding portion at a location that contacts with one end of the first portion 410. By coupling of the protruding portion and the housing hole, the second portion 450 may be rotatably coupled to the first portion 410.

Further, the first portion 410 of the damping contact member 400 may form at least one fixing groove at one end, and the second portion 450 may form at least one corresponding groove facing the fixing groove at a location that contacts with one end of the first portion 410. In this case, the damping contact member 400 may further include a fixing pin that fixes the first portion 410 and the second portion 450. In particular, the fixing pin may penetrate the fixing groove and the corresponding groove. Various kinds and sizes of such a fixing pin may be used. By coupling of the fixing groove, the corresponding groove, and the fixing pin, the second portion 450 may be rotatably coupled relative to the first portion 410.

According to an exemplary embodiment, the damping contact member 400 may include a stopper 415 that limits the second portion 450 from rotating in a direction that reduces an angle in which the second portion 450 forms with the first portion 410. Such a stopper 415 may be formed by change of an area of at least one of the first portion 410 and the second portion 450 or may be mounted between the first portion 410 and the second portion 450 as an independent structure body. According to an exemplary embodiment, the stopper 415 of FIG. 4 may protrude in a convex form from a partial area of the first portion 410 toward the second portion 450. For example, the stopper 415 may protrude from one side of the first portion toward the second portion.

Such a stopper 415 limits the second portion 450 from rotating toward the first portion 410 to enable the damping contact member 400 to maintain a damper function. Specifically, when a lateral pressure is vertically applied to the damping contact member 400 as may result from an unintended impact to the electronic device 100, the stopper 415 may prevent the second portion 450 from rotating toward the first portion 410 to support the damping contact member 400 to maintain a damper structure. In a state in which the stopper 415 does not exist, when a lateral pressure occurs, the second portion 450 rotates toward the first portion 410 and thus a "Z"-shaped damper structure may be collapsed.

The damping contact member 400 electrically connects the terminal and the PCB 300 of the electronic device 100 to transfer a signal (e.g., electrical signal) collected from the PCB 300 to the terminal. Further, the damping contact member 400 may include a first portion 410 fixed to a first component of the electronic device 100 and a second portion 450 rotatably connected to the first portion 410 and that contacts with the magnetic body 500 or a second component of the electronic device 100 by a magnetic force of the magnetic body 500. Further, the damping contact member 400 further includes a connection portion 455 to connect the first portion 410 and the second portion 450. In a state in which the first portion 410 is fixed to the first component of the electronic device 100, the second portion 450 contacts with the magnetic body 500 or a second component of the electronic device 100 by a magnetic force, thereby minimizing a repulsive force because of the damping contact member 400.

Unlike a case in which a "C"-shaped damping member is coupled between the first component and the second component of the electronic device 100, because the damping contact member 400 according to various exemplary embodiments of the present disclosure has a structure in which a portion is fixed and other portions thereof rotate by a magnetic force, the damping contact member 400 may connect the PCB 300 and the terminal in a state in which a repulsive force is minimized. Thereby, damage that may occur in an internal component of the electronic device 100 can be minimized because of a repulsive force.

Further, the damping contact member 400 according to various exemplary embodiments of the present disclosure is formed in a "Z"-shaped structure that includes a stopper 415 and in which the second portion 450 is prevented from rotating toward the first portion 410; thus, an external impact can be effectively absorbed.

Figure 5:
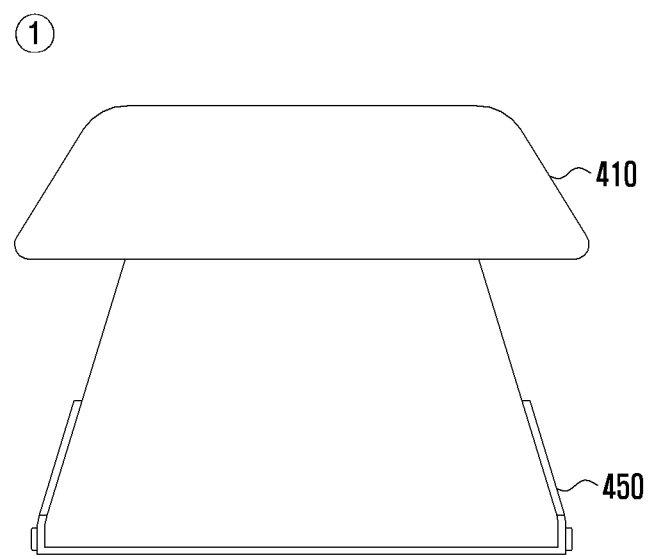
FIG. 5 is a front view illustrating the connection member of FIG. 4 viewed in a first direction ① according to an exemplary embodiment of the present disclosure.
Figure 6:
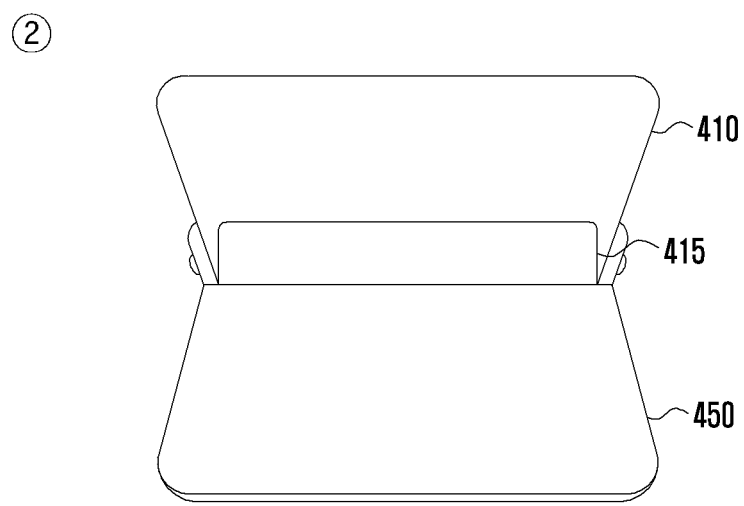
FIG. 6 is a rear view illustrating the connection member of FIG. 4 viewed in a second direction ② according to an exemplary embodiment of the present disclosure.
Figure 7:
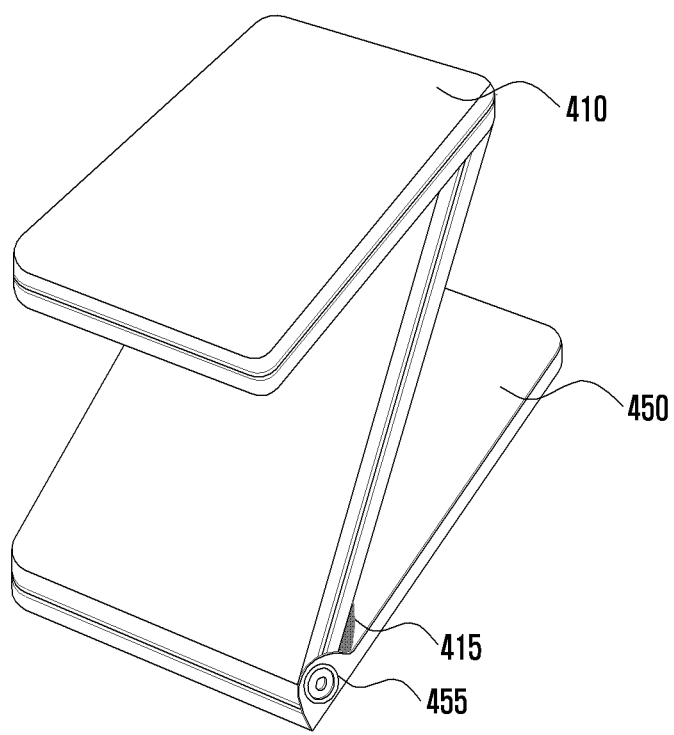
FIG. 7 is a perspective view illustrating the connection member of FIG. 4 according to an exemplary embodiment of the present disclosure.

FIG. 5 is a front view illustrating the damping contact member 400 of FIG. 4 viewed in a direction ① according to an exemplary embodiment of the present disclosure, FIG. 6 is a rear view illustrating the damping contact member 400 of FIG. 4 viewed in a direction ② according to an exemplary embodiment of the present disclosure, and FIG. 7 is a perspective view illustrating the damping contact member of FIG. 4 according to an exemplary embodiment of the present disclosure.

A description of constituent elements identical to or corresponding to the damping contact member 400 of FIG. 4 in relation to the damping contact member 400 of FIGS. 5 to 7 may be omitted.

According to various exemplary embodiments, the damping contact member 400 may be made of a ferromagnetic substance that can move according to magnetism. Further, the damping contact member 400 may be made of a Steel Use Stainless (SUS)-based material. In order to prevent oxidation and corrosion and to improve electric conductivity, gold or nickel plating may be applied to the outside of the damping contact member 400.

Figure 8:
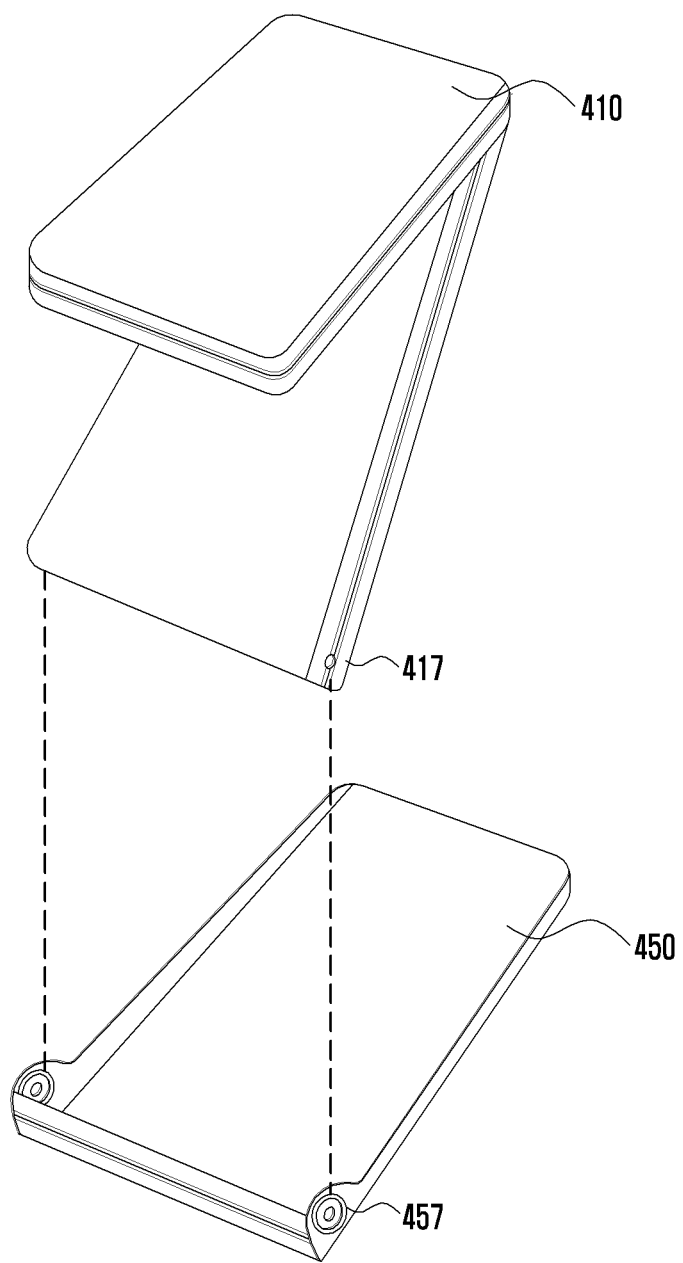
FIG. 8 is an exploded perspective view illustrating a detailed coupling structure of the connection member of FIG. 4 according to an exemplary embodiment of the present disclosure.

FIG. 8 is an exploded perspective view illustrating a detailed coupling structure of the damping contact member 400 of FIG. 4 according to an exemplary embodiment of the present disclosure.

In a description of FIG. 8, constituent elements identical to or corresponding to those in a description of FIG. 4 may be omitted.

As shown in FIG. 8, the damping contact member 400 may be formed by coupling of the first portion 410 and the second portion 450. For this reason, the first portion 410 may have a protruding portion 417 at both side portions of one end, and the second portion 450 may have a housing hole 457 at both side portions of one end so as to house the protruding portion 417. In order to insert and fix the protruding portion 417 into the housing hole 457, one end of the second portion 450 may be extended in a predetermined height. By coupling the protruding portion 417 of the first portion 410 and the housing hole 457 of the second portion 450, a connection portion of the damping contact member 400 may be formed.

Although not shown in FIG. 8, a connection portion according to various exemplary embodiments of the present disclosure may include at least one fixing groove formed at one end of the first portion 410, at least one corresponding groove formed opposite to the fixing groove, and a fixing pin that fixes the first portion 410 and the second portion 450 by penetrating the fixing groove and the corresponding groove. In this case, the corresponding groove may be formed in an area of the second portion 450 that contacts with one end of the first portion 410.

Further, according to various exemplary embodiments of the present disclosure, in the damping contact member 400, the first portion 410 and the second portion 450 may be integrally formed. For example, the second portion 450 may be extended to the first portion 410. In this case, the second portion 450 may contact with the magnetic body 500 or a specific component of the electronic device 100 by a magnetic force of the magnetic body 500. According to an exemplary embodiment, the second portion 450 may be made of a material having flexibility larger than that of the first portion 410. Thereby, the second portion 450 may be bent by a magnetic force of the magnetic body 500, and a bent portion may contact with the magnetic body 500 or a specific electronic component of the electronic device 100.

As described above, the damping contact member 400 may guide a rotation of the second portion 450 through a configuration of a connection portion according to various exemplary embodiments. Thereby, the damping contact member 400 may stably connect the terminal and the PCB 300 while minimizing a repulsive force thereof.

Figure 9:
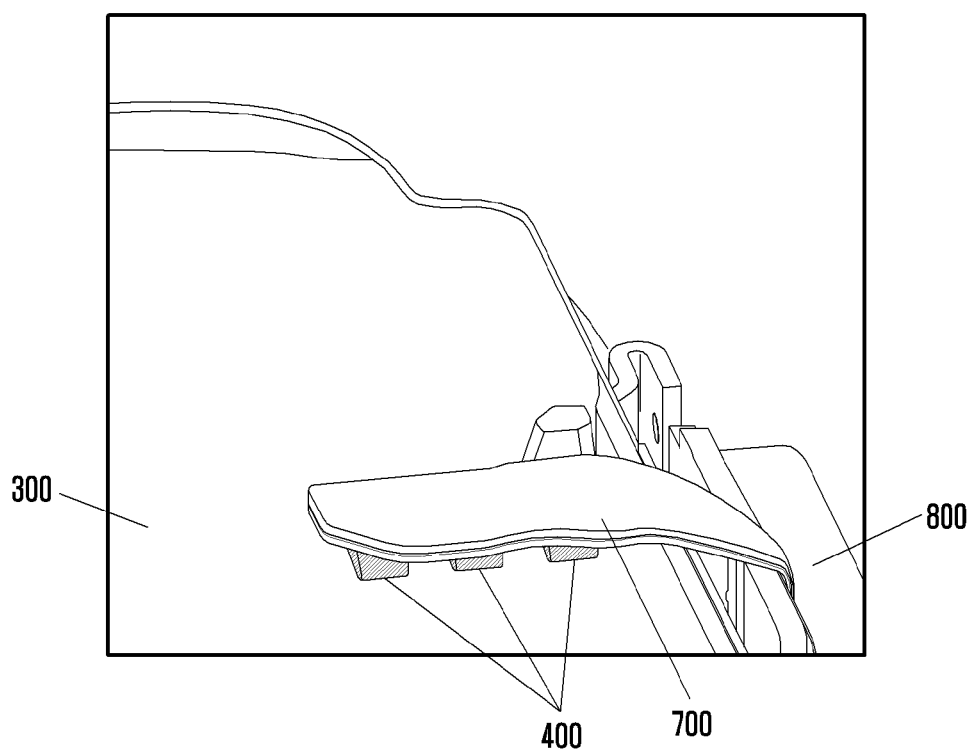
FIG. 9 is a diagram illustrating a state in which a connection member and a magnetic body are located between a Key Flexible Printed Circuit Board (Key FPCB) and a PCB according to various exemplary embodiments of the present disclosure.

FIG. 9 is a diagram illustrating a state in which the damping contact member 400 and the magnetic body (not shown) are located between a key FPCB and the PCB 300 according to various exemplary embodiments of the present disclosure. The key FPCB (or key PCB) is connected to a side key 800 to recognize pressing information of the side key 800 and may include a key FPCB contact terminal 700. Such a key FPCB contact terminal 700 may collect a signal from the PCB 300 or may provide a signal collected from the side key 800 to the PCB 300.

The electronic device 100 may mount the key FPCB contact terminal 700, the damping contact member 400, and the PCB 300. Such a key FPCB contact terminal 700, damping contact member 400, and PCB 300 may be supported by the rear case 170. Components of FIG. 9 are shown to describe a specific portion of the electronic device 100, and the electronic device 100 according to various exemplary embodiments of the present disclosure is not limited to such components.

The key FPCB contact terminal 700 may correspond to an antenna terminal included in the antenna structure body 200 of FIGS. 2A to 3D. The damping contact member 400 of FIG. 9 may correspond to the damping contact member 400 of FIGS. 3 to 8. Further, the PCB 300 of FIG. 9 may correspond to the PCB 300 of FIGS. 3A to 3D. Further, in the key FPCB contact terminal 700 and the PCB 300, the magnetic body (not shown) may be mounted to correspond to a location of the magnetic body 500 of FIGS. 3A to 3D.

A difference between a configuration of FIG. 9 and a configuration of the foregoing drawings is that the damping contact member 400 and the magnetic body (not shown) may be connected to other components other than the antenna structure body 200. In other words, the damping contact member 400 of FIG. 9 is located between the key FPCB contact terminal 700 and the PCB 300 to provide a damper function and a contact point function. Further, the magnetic body (not shown) may be mounted or embedded in at least one of the key FPCB contact terminal 700, the PCB 300, and the damping contact member 400 with the same principle as that of FIGS. 3A to 3D.

Figure 10:
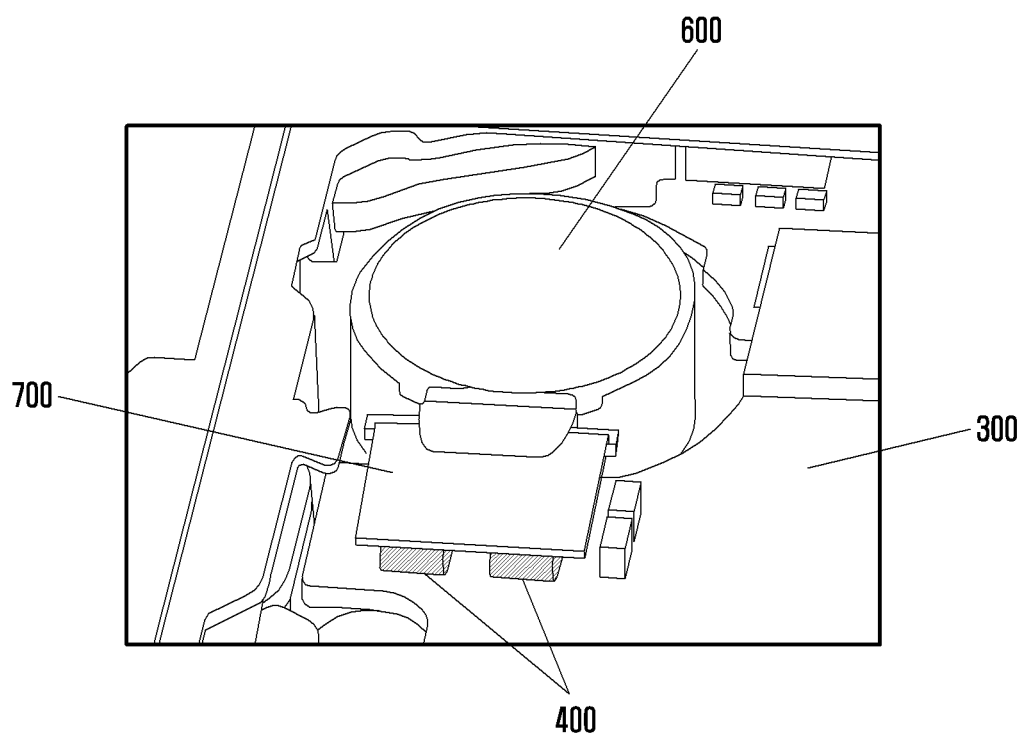
FIG. 10 is a diagram illustrating a state in which a connection member and a magnetic body are located between a motor FPCB and a PCB according to various exemplary embodiments of the present disclosure.

FIG. 10 is a diagram illustrating a state in which the damping contact member 400 and the magnetic body (not shown) are located between a motor FPCB and the PCB 300 according to various exemplary embodiments of the present disclosure.

The motor FPCB is connected to a motor 600 to recognize driving information of the motor 600 and may include a motor FPCB contact terminal 700. Such a motor FPCB contact terminal 700 may collect a signal from the PCB 300 or may provide a signal collected from the motor 600 to the PCB 300.

A difference between a configuration of FIG. 10 and a configuration of the foregoing drawings is that the damping contact member 400 and the magnetic body (not shown) may be connected to other components other than the antenna structure body 200 and the key FPCB contact terminal 700. In other words, the damping contact member 400 of FIG. 10 is located between the motor FPCB contact terminal 700 and the PCB 300 to provide a damper function and a contact point function. Further, the magnetic body (not shown) may be mounted or embedded in at least one of the motor FPCB contact terminal 700, the PCB 300, and the damping contact member 400 with the same principle as that of FIGS. 3A to 3D.

In exemplary embodiments described in relation to FIGS. 9 and 10, the damping contact member 400 and the magnetic body (not shown) according to various exemplary embodiments of the present disclosure may be connected to various electronic components within the electronic device 100. In this case, similarly, the damping contact member 400 and the magnetic body (not shown) may maintain a contact point between components by minimizing a repulsive force of the damping contact member 400 and provide a stable damper function by a structure of the damping contact member 400.

Further, FIGS. 9 and 10 illustrate that the PCB 300 and a specific FPCB of electronic components of the electronic device 100 are connected through the damping contact member 400 and the magnetic body (not shown), but the present disclosure is not limited thereto. The damping contact member 400 and the magnetic body (not shown) according to various exemplary embodiments of the present disclosure may function as a contact structure between the PCB 300 and the FPCB and function as a contact structure of the FPCB and the PCB 300 regardless of a kind and form of a component.

Figure 11A:
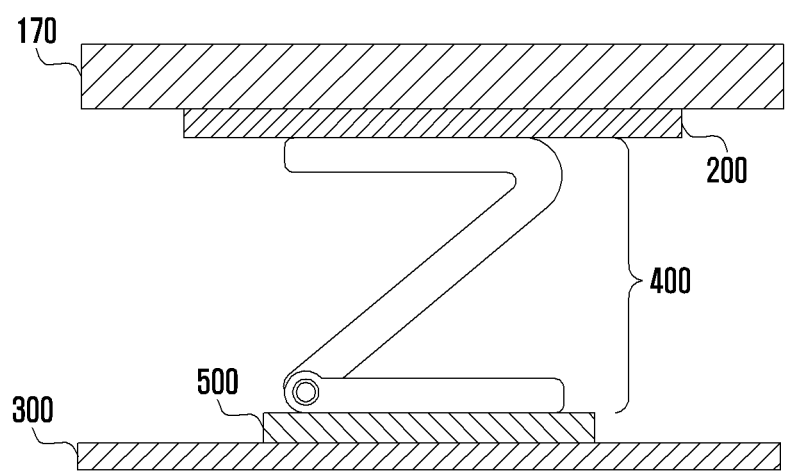
FIG. 11A is a diagram illustrating a connection member and a magnetic body.
Figure 11B:
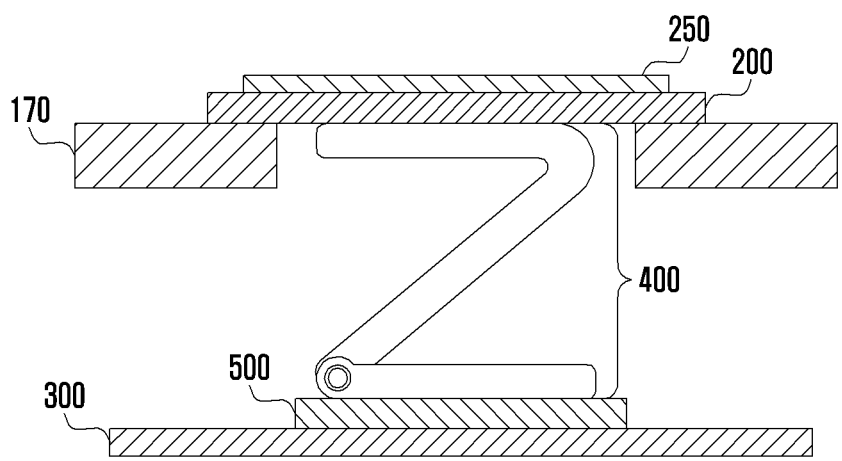
FIG. 11B is a diagram illustrating an electronic device further including a strength reinforcing member according to a kind of a rear case.

FIG. 11A is a diagram illustrating a damping contact member 400 and a magnetic body 500 according to various exemplary embodiments of the present disclosure, and FIG. 11B is a diagram illustrating an electronic device 100 further including a strength reinforcing member 250 according to a kind of a rear case 170.

As shown in FIG. 11A, the electronic device 100 may include a rear case 170, antenna structure body 200, PCB 300, damping contact terminal 400, and magnetic body 500. A configuration of the electronic device 100 of FIG. 11A may correspond to a structure of FIG. 2A or FIG. 2B.

According to an exemplary embodiment, the antenna structure body 200 may be classified into a flexible type (FPCB structure) and a hard type (carrier structure or SUS structure) according to a material. In a case of FIG. 11A, because an upper portion of the antenna structure body 200 is supported by the rear case 170, the antenna structure body 200 is not lifted or pulled by the damping contact member 400 regardless of a material.

The electronic device 100 of FIG. 11B may include a rear case 170, antenna structure body 200, strength reinforcing member 250, PCB 300, damping contact member 400, and magnetic body 500. A configuration of the electronic device 100 of FIG. 11B may correspond to a structure of FIG. 3A.

Unlike the antenna structure body 200 of FIG. 11A, in the antenna structure body 200 of FIG. 11B, a rear case area that supports the antenna structure body 200 does not exist. When the antenna structure body 200 is made of a flexible type material and when the strength reinforcing member 250 does not exist, the antenna structure body 200 may be lifted by the damping contact member 400 or may be pulled by the magnetic body 500. Therefore, the electronic device 100 further includes a strength reinforcing member 250, thereby preventing the antenna structure body 200 from being damaged. When the antenna structure body 200 is made of a hard type (e.g., injection, metal, plating structure) material, the strength reinforcing member 250 may be omitted or may be included.

According to various exemplary embodiments, the strength reinforcing member 250 may be formed with a battery cover or back glass. For example, at least one of the antenna structure body 200 and the strength reinforcing member 250 may be mounted in a battery cover or back glass of the electronic device 100. According to various exemplary embodiments, the strength reinforcing member 250 may be made of various materials, for example, it may be made of a material formed by injection of a synthesis resin such as plastic and may be made of a material such as glass or ceramic.

Figure 12A:
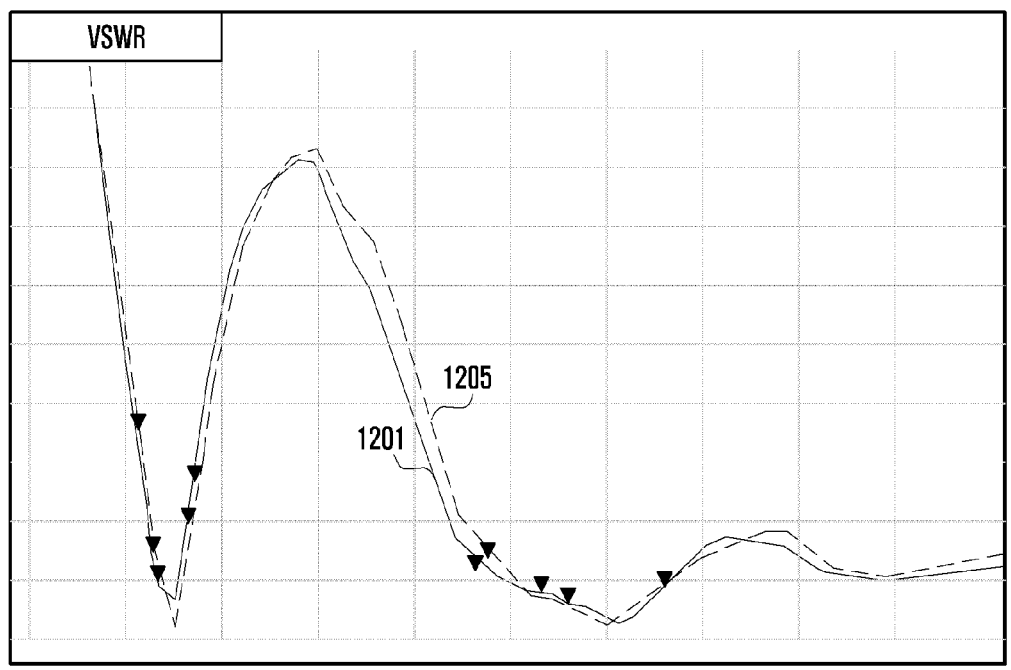

FIGS. 12A and 12B are diagrams illustrating a comparison experimental value of an antenna performance before and after using the damping contact member 400 and the magnetic body 500 in the electronic device 100 according to an exemplary embodiment of the present disclosure.

A graph 1201 indicated by a solid line represents a Voltage Standing Wave Ratio (VSWR) measurement value, which is an antenna performance before applying the damping contact member 400 and the magnetic body 500 in the electronic device 100, and a graph 1205 indicated by a dotted line represents a VSWR measurement value when applying the damping contact member 400 and the magnetic body 500 according to various exemplary embodiments of the present disclosure. Such an experiment graph enables to determine whether an antenna performance is deteriorated when the magnetic body 500 contacts with the damping contact member 400.

As shown in FIGS. 12A and 12B, even if the magnetic body 500 contacts with the damping contact member 400 according to various exemplary embodiments of the present disclosure, it may be determined through a graph and a numerical value that little difference exists in an antenna performance. That is, by using the damping contact member 400 and the magnetic body 500 according to various exemplary embodiments of the present disclosure, while maintaining an antenna performance, peripheral components can be prevented from being damaged and a damper function can be stably provided.

Figure 13A:
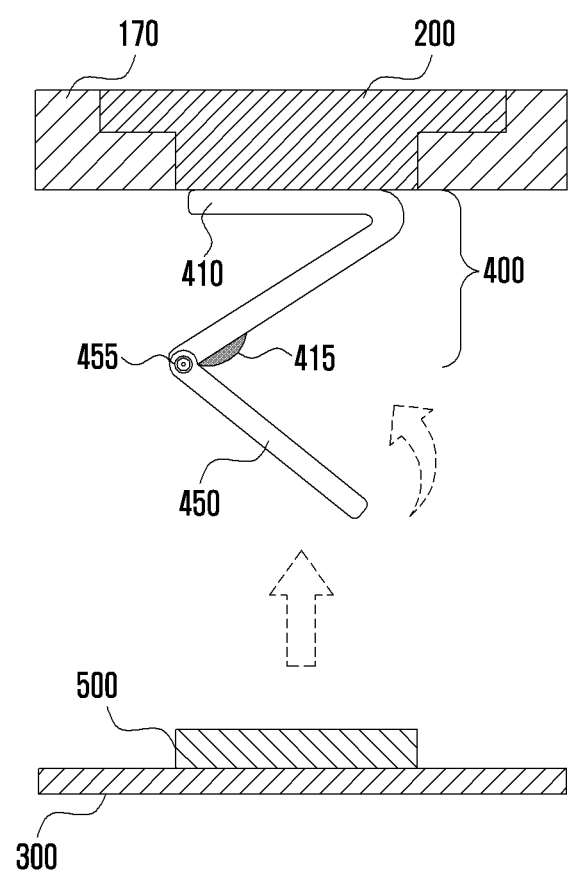
FIG. 13A and FIG. 13B are diagrams illustrating a coupling structure of a connection member and a magnetic body according to an exemplary embodiment of the present disclosure.
Figure 13B:
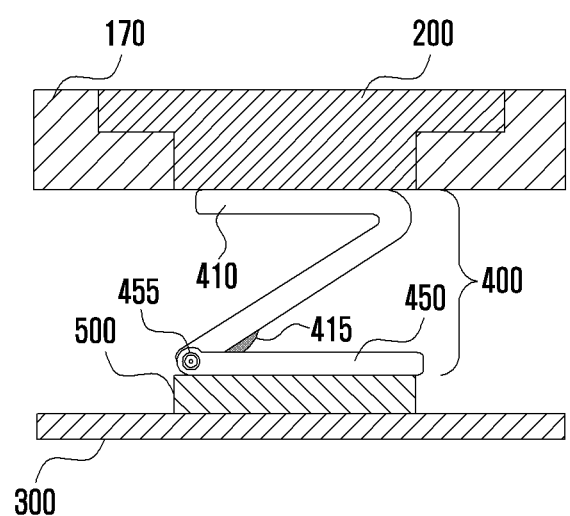

FIGS. 13A and 13B are diagrams illustrating a coupling structure of the connection member 400 and the magnetic body 500 according to an exemplary embodiment of the present disclosure.

As shown in FIG. 13A, according to an exemplary embodiment, in the electronic device 100, the rear case 170 and the antenna structure body 200 are coupled according to an assembly process, and the first portion 410 of the damping contact member 400 may be fixed to a terminal of the antenna structure body 200 by soldering. Further, the magnetic body 500 may be mounted in the PCB 300. In this case, the magnetic body 500 may be fixed to the PCB 300 by soldering. The second portion 450 of the damping contact member 400 may be inclined in an opposite direction of the first portion 410 in a state connected to the first portion 410. According to various exemplary embodiments, according to a level of a coupling force of the first portion 410 and the second portion 450, the second portion 450 is not inclined to a lower portion but is fixed to the first portion 410 to maintain a shape "Z".

As shown in FIG. 13B, a coupling member of the rear case 170, the antenna structure body 200, and the first portion 410 and a coupling member of the second portion 450, the magnetic body 500, and the PCB 300 may be coupled. In this case, the rotatable second portion 450 may rotate toward the first portion 410. Further, the second portion 450 may be limited from rotating to the first portion 410 to a predetermined level by the stopper 415.

As described above, as the second portion 450 connected to rotate relative to the first portion 410 is pulled by the magnetic body 500, the damping contact member 400 may connect the PCB 300 and an electronic component (the antenna structure body 200). Thereby, the damping contact member 400 supports a stable damper function and can minimize damage of an electronic component connected to a connection member by minimizing a repulsive force of the connection member.

As described above, an electronic device according to various exemplary embodiments of the present disclosure minimizes a repulsive force of a connection member through a combination of a magnetic body and the connection member, thereby minimizing damage from occurring in an electronic component connected to the connection member.

Further, while minimizing a repulsive force of a connection member through a magnetic body and a connection member according to various exemplary embodiments of the present disclosure, a damper function can be efficiently performed.

Although exemplary embodiments of the present disclosure have been described in detail hereinabove, it should be clearly understood that many variations and modifications of the basic inventive concepts herein described, which may appear to those skilled in the art, will still fall within the spirit and scope of the exemplary embodiments of the present disclosure as defined in the appended claims.

What is claimed is:

1. An electronic device, comprising:
a printed circuit board (PCB);
a plurality of electronic components electrically connected to the PCB; and
a connection member comprising a first portion fixed to one of the PCB and an electronic component and a second portion magnetically connected to other one of the PCB and the electronic component,
wherein the second portion of the connection member is moveably connected to the first portion, and wherein the connection member further comprises a stopper, the stopper being coupled to the first portion and limiting the second portion from rotating in a direction that reduces an angle formed between the second portion and the first portion.

2. The electronic device of claim 1, further comprising a magnetic body, and wherein the magnetic body is mounted or embedded in any one of the PCB, the electronic component, and the second portion of the connection member.

3. The electronic device of claim 1, wherein the connection member is formed in a shape "Z", the "Z" shape including a "7" shaped section and a leg hingedly attached to the "7" shape, thereby forming the "Z" shape.

4. An electronic device, comprising:
a printed circuit board (PCB);
a plurality of electronic components electrically connected to the PCB; and
a connection member comprising a first portion fixed to one of the PCB and an electronic component and a second portion magnetically connected to other one of the PCB and the electronic component, wherein the second portion of the connection member is moveably connected to the first portion, and
wherein the first portion further includes one or more protruding portions at one end, and the second portion further includes one or more housing holes that houses the one or more protruding portions.

5. An electronic device of claim 1, further comprising:
a printed circuit board (PCB);
a plurality of electronic components electrically connected to the PCB; and
a connection member comprising a first portion fixed to one of the PCB and an electronic component and a second portion magnetically connected to other one of the PCB and the electronic component,
wherein the second portion of the connection member is moveably connected to the first portion,
wherein the connection member further comprises a connection portion, the connection portion including a fixing groove at one end of the first portion, the second portion including a corresponding groove facing the fixing groove, and a fixing pin that penetrates the fixing groove and the corresponding groove to fix the first portion and the second portion.

6. The electronic device of claim 1, wherein the stopper protrudes toward the second portion at one side of the first portion.

7. The electronic device of claim 1, wherein the second portion is made of a material that has a flexibility greater than that of the first portion.

8. The electronic device of claim 1, wherein at least one of the plurality of electronic components comprises a Flexible Printed Circuit Board (FPCB), and the connection member connects the FPCB and a PCB.

9. The electronic device of claim 1, wherein the plurality of electronic components comprises an antenna pattern, key FPCB, and motor FPCB of the electronic device.

10. The electronic device of claim 1, wherein the electronic component further comprises a strength reinforcing member at a surface opposite to a surface contacting with the connection member.

11. The electronic device of claim 1, further comprising a magnetic body, and wherein the magnetic body is a neodymium magnet, and the outside of the magnetic body is plated with nickel.

12. The electronic device of claim 1, wherein the connection member is made of a SUS-based material, and the outside of the connection member is plated with nickel.

* * * * *